US012811546B2

(12) United States Patent
Cristofoli et al.

(10) Patent No.: US 12,811,546 B2
(45) Date of Patent: Nov. 24, 2026

(54) NESTED FLOATING-INVERTER BASED AMPLIFIER

(71) Applicants: Infineon Technologies AG, Neubiberg (DE); Politecnico Di Milano, Milan (IT)

(72) Inventors: Andrea Cristofoli, Villach (AT); Gabriele Zanoletti, Clusone (IT); Luca Bertulessi, San Paolo d-Argon (IT)

(73) Assignee: Infineon Technologies AG, Neubiberg (DE)

(*) Notice: Subject to any disclaimer, the term of this patent is extended or adjusted under 35 U.S.C. 154(b) by 600 days.

(21) Appl. No.: 18/446,005

(22) Filed: Aug. 8, 2023

(65) Prior Publication Data

US 2025/0055421 A1 Feb. 13, 2025

(51) Int. Cl.
*H03F 1/30* (2006.01)
*H03F 3/16* (2006.01)

(52) U.S. Cl.
CPC ............... *H03F 1/301* (2013.01); *H03F 3/16* (2013.01)

(58) Field of Classification Search
None
See application file for complete search history.

(56) References Cited

U.S. PATENT DOCUMENTS 5,847,601 A * 12/1998 Wang .................. H03F 3/45264 330/258
8,928,406 B2 * 1/2015 Albinet ............... H03F 3/45636 330/253
11,539,336 B2 12/2022 Sun et al.
2002/0140491 A1 * 10/2002 Shim ........................ H03K 5/13 327/355

OTHER PUBLICATIONS

Kumar, R.S. Ashwin et al., "Analysis and Design of a Discrete-Time Delta-Sigma Modulator Using a Cascoded Floating-Inverter-Based Dynamic Amplifier", IEEE Journal of Solid-State Circuits, vol. 57, No. 11, Nov. 2022, 12 pages.
Lu, Jie et al., "An Overview of Noise-Shaping SAR ADC: From Fundamenetals to the Frontier", IEEE Open Journal File, Solid-State Circuits Society, Oct. 13, 2021, 13 pages.
Tang, Xiyuan et al., "An Energy-Efficient Comparator With Dynamic Floating Inverter Amplifier", IEEE Journal of Solid-State Circuits, vol. 55, No. 4, Apr. 2020, 12 pages.
Tang, Xiyuan et al., "A 13.5-ENOB, 107-µW Noise-Shaping SAR ADC With PVT-Robust Closed-Loop Dynamic Amplifier", IEEE Journal of Solid-State Circuits, vol. 55, No. 12, Dec. 2020, 12 pages.
Wang, Tzu-Han et al., "A 13.8-ENOB Fully Dynamic Third-Order Noise-Shaping SAR ADC in a Single-Amplifier EF-CIFF Structure With Hardware-Reusing kT/C Noise Cancellation", IEEE Journal of Solid-State Circuits, vol. 56, No. 12, Dec. 2021, 13 pages.

* cited by examiner

*Primary Examiner* — Andrea Lindgren Baltzell
*Assistant Examiner* — Malane Lieng
(74) *Attorney, Agent, or Firm* — Slater Matsil, LLP

(57) ABSTRACT

In accordance with an embodiment, a nested floating inverter dynamic amplifier (FIDA) includes: a first FIDA amplifier comprising a plurality of first inverters switchably coupled to a first reservoir capacitor; and a second FIDA amplifier comprising a plurality of second inverters switchably coupled to a second reservoir capacitor, wherein outputs of the plurality of first inverters are coupled to corresponding inputs of the plurality of second inverters.

22 Claims, 7 Drawing Sheets

NESTED FLOATING-INVERTER BASED AMPLIFIER

TECHNICAL FIELD

The present invention relates generally to a system and method for an electronic system and, in particular embodiments, to a system and method for a nested floating inverter-based amplifier.

BACKGROUND

A floating inverter dynamic amplifier (FIDA) is a type of amplifier that uses an inverter-based amplifier and a reservoir capacitor. During operation, the reservoir capacitor is first charged via a power supply. Next the reservoir capacitor is disconnected from the power supply and connected to power supply terminals of the inverter-based amplifier in a floating configuration to supply power to the amplifier. A FIDA can achieve high energy efficiency, low noise, as well as reduced influence of the input common-mode voltage on the circuit performance.

FIDAs can be used in various applications that require high-speed and low-power analog signal processing, such as comparators, amplifiers, analog-to-digital converters (ADCs), and digital-to-analog converters (DACs). For example, a FIDA may be used as a pre-amplifier for a comparator or as an amplifier in a switched-capacitor amplifier system.

However, existing FIDA designs have some limitations and challenges, such as low gain accuracy, and high variation of the output response over process, supply voltage, and temperature (PVT) variations.

SUMMARY

In accordance with an embodiment, a nested floating inverter dynamic amplifier (FIDA) includes: a first FIDA amplifier comprising a plurality of first inverters switchably coupled to a first reservoir capacitor; and a second FIDA amplifier comprising a plurality of second inverters switchably coupled to a second reservoir capacitor, wherein outputs of the plurality of first inverters are coupled to corresponding inputs of the plurality of second inverters.

In accordance with another embodiment, a method of operating a nested floating inverter dynamic amplifier (FIDA) comprising a first FIDA amplifier comprising a plurality of first inverters switchably coupled to a first reservoir capacitor, a second FIDA amplifier comprising a plurality of second inverters switchably coupled to a second reservoir capacitor, wherein outputs of the plurality of first inverters are coupled to corresponding inputs of the plurality of second inverters includes: during a charging phase, charging the first reservoir capacitor and the second reservoir capacitor to a first voltage; and during an amplification phase, connecting the first reservoir capacitor to the plurality of first inverters and connecting the second reservoir capacitor to the plurality of second inverters, wherein the first FIDA amplifier and the second FIDA amplifier are configured to float during the amplification phase.

In accordance with a further embodiment, a circuit includes: a first inverter having an input coupled to a first input node; a first load inverter coupled to an output of the first inverter, wherein an input of the first load inverter is connected to an output of the first load inverter; a second inverter having an input coupled to a second input node; a second load inverter coupled to an output of the first inverter, wherein an input of the second load inverter is connected to an output of the second load inverter; a first reservoir capacitor switchably coupled to power supply nodes of the first inverter and the second inverter; and a second reservoir capacitor switchably coupled to power supply nodes of the first load inverter and the second load inverter.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention are directed to a FIDA amplifier having a stabilized gain. In an embodiment, a FIDA amplifier includes a first FIDA amplifier loaded by a second FIDA amplifier having its input coupled to its outputs. In some embodiments, the various components of the second FIDA amplifier are scaled according to a common scaling factor with respect to the first FIDA amplifier. The resulting embodiment FIDA amplifier advantageously exhibits a stable gain that is a function of the common scaling factor. In some embodiments, this stable gain is advantageously robust to PVT variations and random mismatch.

Figure 1A:
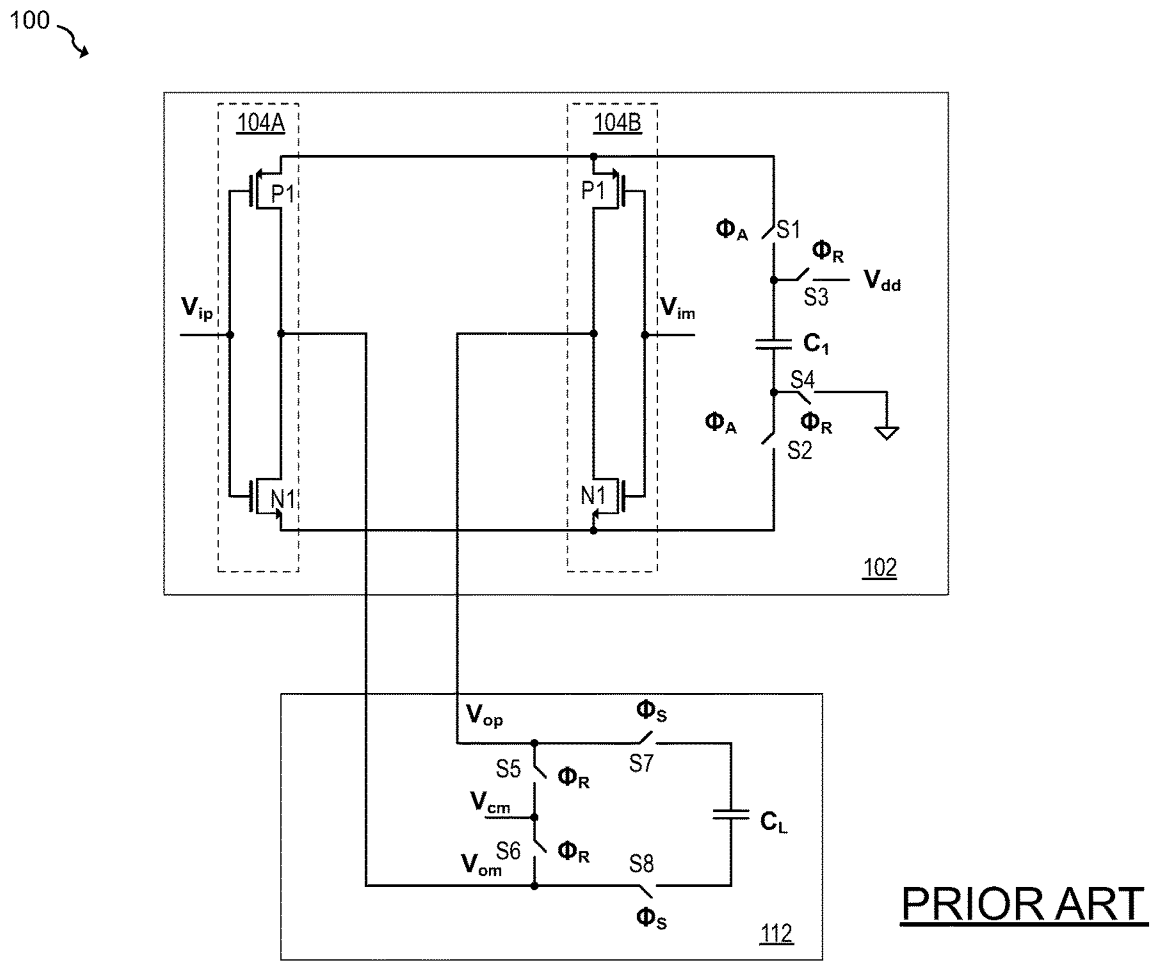
PRIOR ART Fig. 1A
FIG. 1A illustrates a schematic of a conventional FIDA system.

FIG. 1 illustrates a conventional FIDA system 100 that includes FIDA core 102 and load circuit 112. As shown, amplifier core 102 includes two inverters 104A and 104B coupled to reservoir capacitors $C_1$ via a switching network that includes switches S1, S2, S3 and S4. Load circuit 112 includes load capacitor $C_L$ coupled to the outputs of inverters 104A and 104B via a switching network that includes switches S5, S6, S7, and S8. As shown, each inverter includes a PMOS transistor P1 and NMOS transistor N1. Reset switching signal $\Phi_R$ is used to control switches S3, S4, S5 and S6, amplification switching signal $\Phi_A$ is used to control switches S1 and S2, and sampling switching signal $\Phi_S$ is used to control switches S7 and S8.

Figure 1B:
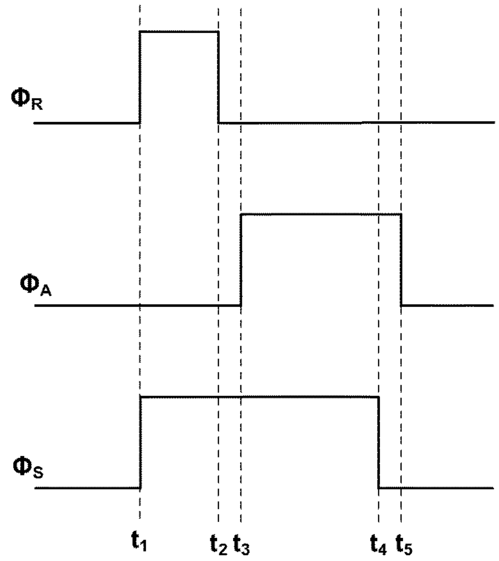
FIG. 1B illustrates a timing diagram that can be used for conventional and embodiment FIDA systems.

FIG. 1B illustrates a timing diagram that illustrates the operation of FIDA system 100 as well as the timing of embodiments described herein. During a first phase of operation, reset switching signal $\Phi_R$ and sampling switching signal $\Phi_S$ are asserted when amplification switching signal $\Phi_A$ is not asserted. During this phase of operation, reservoir capacitor C1 is coupled between power supply node $V_{dd}$ and ground via switches S3 and S2 respectively. Inverters 104A and 104B are disconnected from reservoir capacitor C1 and common mode voltage $V_{cm}$ is applied to the outputs of inverters 104A and 104B via switches S5 and S6 and to load capacitor $C_L$. At time $t_2$ reset switching signal (R is de-asserted, which disconnects reservoir capacitor C1 from power supply node $V_{dd}$ and ground, and disconnects the common mode voltage node $V_{cm}$ from the outputs of inverters 104A and 104B and load capacitor $C_L$.

A second phase of operation begins at time $t_3$ when amplification switching signal $\Phi_A$ is asserted. In this second phase of operation, reservoir capacitor C1 is applied to the power supply nodes of inverters 104A and 104B, which allows current to flow in inverters 104A and 104B, thereby allowing inverters 104A and 104B to amplify input signals $V_{ip}$ and $V_{im}$ and to produce amplified output signals $V_{om}$ and $V_{op}$. During this phase of operation, as reservoir capacitor $C_1$ is discharged, the current through transistors P1 and N1 of inverters 104A and 104B steadily decreases. In some cases, transistors P1 and N1 start out in moderate inversion and end up in weak inversion.

At time $t_4$, sampling switching signal $\Phi_S$ is de-asserted, which disconnects load capacitor $C_L$ from inverters 104A and 104B by opening switches S7 and S8, thereby sampling output voltages $V_{op}$ and $V_{om}$ on load capacitor $C_L$. This period of time may be referred to as a sampling phase or a readout phase. At time $t_5$, amplification switching signal $\Phi_A$ is de-asserted and a next cycle operation may occur again starting at time $t_1$.

Figure 1C:
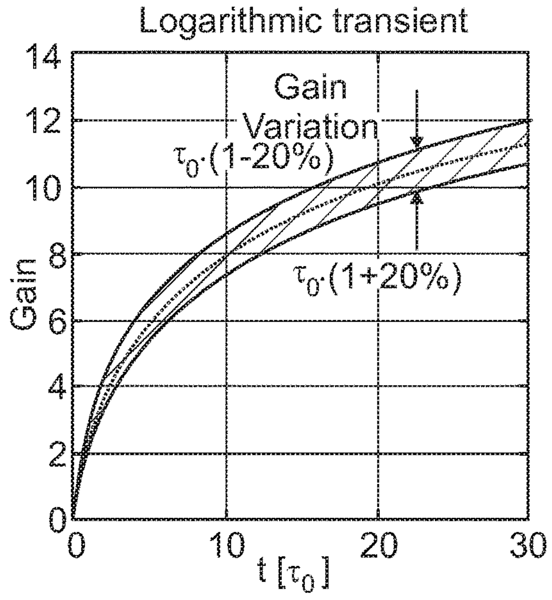
FIG. 1C illustrates a graph of gain with respect to time for a conventional FIDA system.

FIDA system 100 is current efficient in that it does not require any static bias current. Its structure allows for both PMOS transistor P1 and NMOS transistor N1 to contribute to amplification and provides for intrinsic common mode feedback because no common mode current flows to the output. However, due to its structure and operation, FIDA system 100 has a gain that logarithmically increases with time as shown in the graph of FIG. 1C, which illustrates a gain vs. time characteristic of FIDA core 102. As shown, for the same amplification time t=t4−t3, a 20% variation in the time constant of the circuit $\tau_o$ results in a 10% gain variation. Moreover, the gain of FIDA system 100 is very sensitive to PVT variation, and the speed of the amplifier gets exponentially slower with increased accuracy requirements. In some cases, calibration circuits and algorithms may be used in conjunction with FIDA system 100 to calibrate the gain at the expense of increased complexity.

Figure 2A:
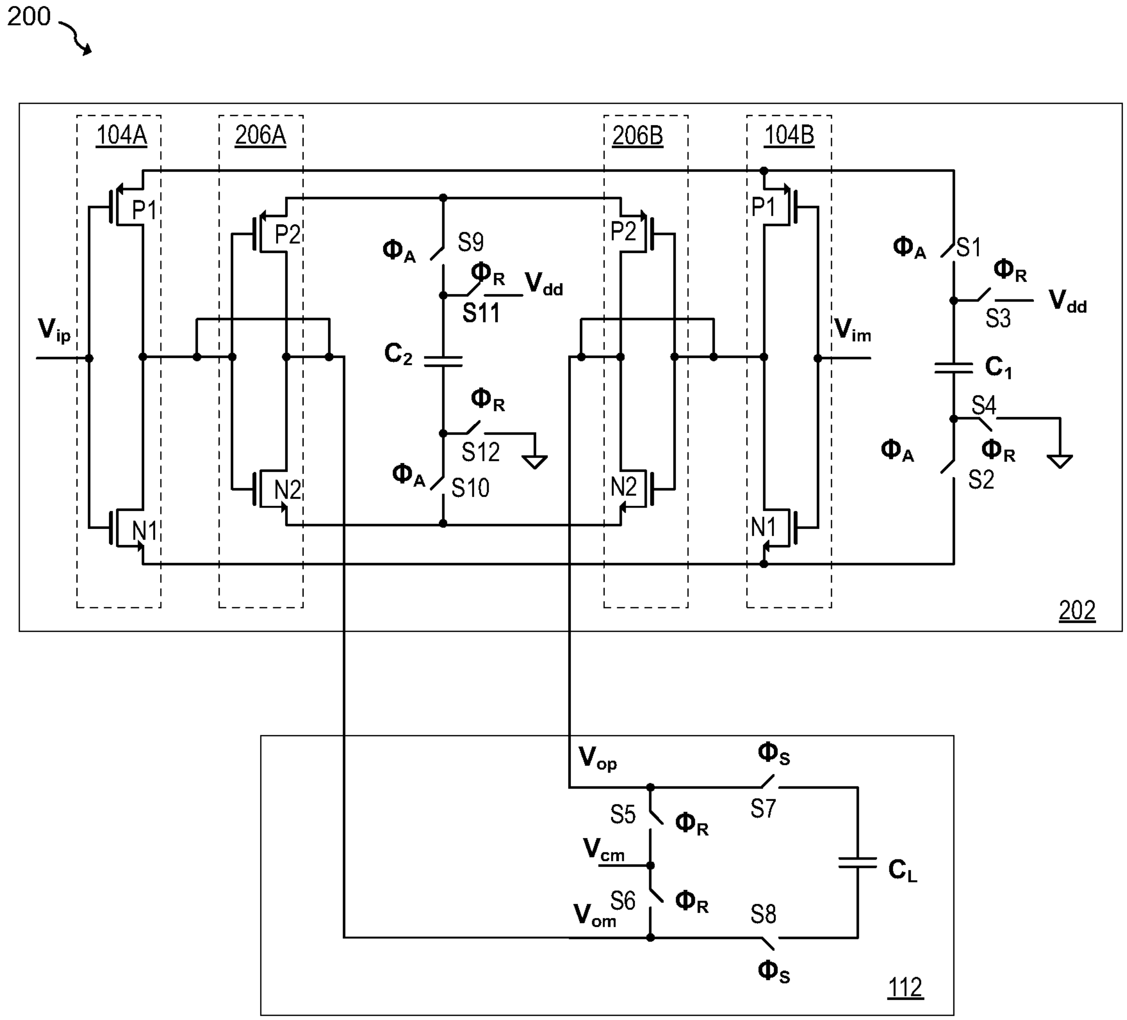
FIG. 2A illustrates a schematic of an embodiment nested FIDA system.

FIG. 2A illustrates a nested FIDA system 200 according to an embodiment of the present invention. As shown, nested FIDA system 200 includes nested FIDA core 202 and load circuit 112. Nested FIDA core 202 is similar to FIDA core 102 shown in FIG. 1A in that it includes reservoir capacitor C1 (also referred to as a first reservoir capacitor) and inverters 104A and 104B that each include PMOS transistor P1 and NMOS transistor N1; however, embodiment nested FIDA core 202 also includes a second FIDA circuit that includes inverters 206A and 206B respectively coupled to the outputs of inverters 104A and 104B, and a second reservoir capacitor C2 switchably coupled to power supply node $V_{dd}$ and ground via switches S11 and S12 and to the power supply nodes of inverters 206A and 206B via switches S9 and S10. In some embodiments, each switch S1 to S12 may be implemented using a transistor, such as an NMOS transistor, PMOS transistor, a CMOS transmission gate made up of an NMOS transistor coupled in parallel with a PMOS transistor or other type of transistor or switching circuit known in the art. As shown, the input and output of inverter 206A are connected together and the input and output of inverter 206B are connected together. In some embodiments, load circuit 112 may be a part of an input stage of a load circuit such as a switched capacitor amplifier and/or a feedback network coupled to FIDA system 200.

During operation, switches S9, S10, S11 and S12 of the second FIDA circuit are switched in a similar manner as switches S1, S2, S3 and S4 of the first FIDA circuit. For example, during the first phase of operation when reset switching signal (R is asserted, second reservoir capacitor $C_2$ is connected to power supply nodes $V_{dd}$ and ground. On the other hand, when amplification switching signal $\Phi_A$ is asserted, second reservoir capacitor $C_2$ is connected to the power supply nodes of inverters 206A and 206B. In various embodiments, the sizes of the components of the second FIDA amplifier are scaled by a common scaling factor F with respect to the first FIDA amplifier. For example, the W/L ratios (also referred to as aspect ratios) of PMOS transistors P2 and NMOS transistors N2 of inverters 206A and 206B is F times smaller than the W/L ratios of PMOS transistors P1 and NMOS transistors N1 of inverters 104A and 104B; second reservoir capacitor $C_2$ has a capacitance F times smaller than first reservoir capacitor $C_1$ such that a ratio of a capacitance of the first reservoir capacitor $C_1$ to a capacitance of the second reservoir capacitor $C_2$ is the common scaling factor F, and switches S9, S10, S11 and S12 are F times smaller than switches S1, S2, S3 and S4. Thus, a ratio of a transconductance of the first FIDA amplifier to the second FIDA amplifier is the common scaling factor F. Another way to express this is that the ratio of a strength of inverter 104A to a strength of inverter 206A, and the ratio of the strength of inverter 104B to the strength of inverter 206B is the common scaling factor F. Moreover, the transistors used to implement switches S9, S10, S11 and S12 are F times smaller than the transistors used to implement switches S1, S2 S3 and S4. In some embodiments, the components (e.g., switches, transistors and capacitors) of the first and second FIDA amplifiers are implemented using unit elements to facilitate a more accurate scaling factor F.

In various embodiments, some or all of the components of nested FIDA system 200 and other embodiment disclosed herein may be implemented on a single monolithic semiconductor integrated circuit, such as a single semiconductor substrate and/or a silicon substrate. Nested FIDA system 200 may be fabricated using one of a variety of different semiconductor processes, such as a CMOS, FinFET, BiCMOS, SOI, or other type of semiconductor process.

Figure 2B:
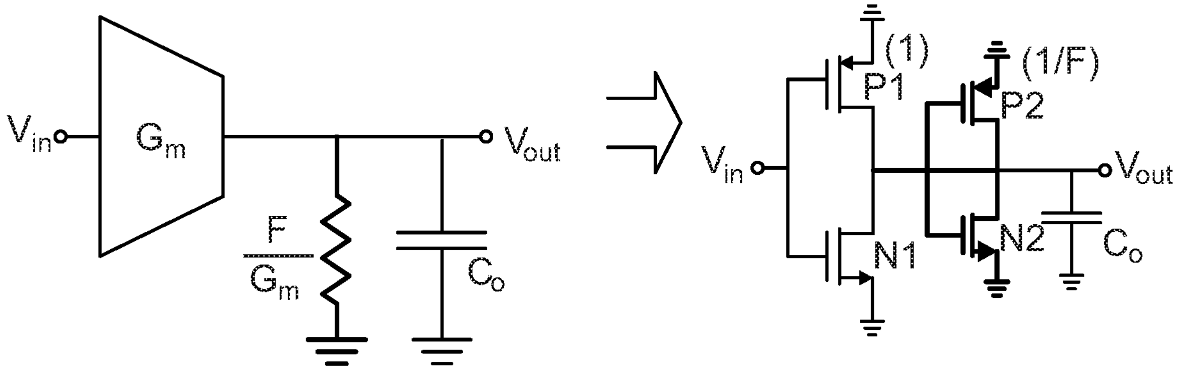
FIG. 2B illustrates an equivalent circuit for an embodiment nested FIDA system.

FIG. 2B illustrates a simplified single-ended circuit model of nested FIDA system 200. As shown, inverters 104A and 104B of the first FIDA are modeled as a transconductance $G_m$; inverters 206A and 206B of the second FIDA are models as a shunt resistance of $F/G_m$; and the capacitance at the output of inverters 104A and 104B is modeled as capacitor $C_o$, where F is the common scaling factor. Accordingly, it can be shown that an asymptotic value for the voltage gain G is ideally the product of the transconductance $G_m$ to the load resistance $F/G_m$:

$$G = V_{in} / V_{out} = G_m * F / G_m = F.$$

When considering finite transistor self-gain μ, it can be shown that the asymptotic value for the voltage gain G is:

$$\lim_{t\to\infty} G(t) = F \parallel \mu$$

Thus, when self-gain p is greater than desired gain F, the asymptotic value for the voltage gain G is approximately G. Thus, in such cases, even when self-gain μ is PVT dependent, the resulting asymptotic value for the voltage gain G is insensitive to PVT variations and random mismatch. It should be appreciated that the transconductance $G_m$ and the load resistance $F/G_m$ are time-varying quantities due to the change in bias current during operation. However, because of the symmetry between transconductance $G_m$ and load resistance $F/G_m$, the product between these two quantities remains constant.

Figure 2C:
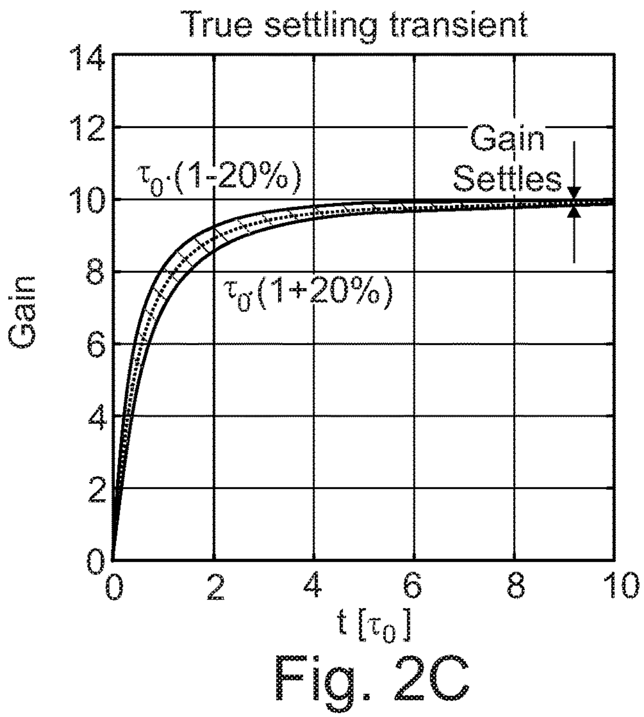
FIGS. 2C, 2D and 2E include graphs illustrating and contrasting the gain vs time characteristic of a conventional FIDA system to an embodiment FIDA system.

FIG. 2C illustrates a graph of gain with respect to time. It can be seen that the gain settles to a value of about 10 within about six time constants assuming a value of F=10. Moreover, it can be seen that a 20% variation in time constant $\tau_o$ has a negligible impact on gain G.

Figure 2D:
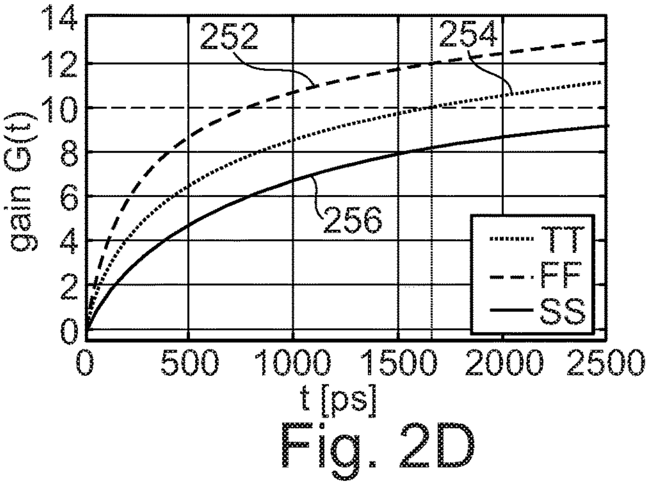

FIG. 2D illustrates a comparison of gain with respect to time for conventional FIDA system 100. Traces 252, 254 and 256 represent the voltage gain of FIDA system 100 for a fast process corner, a nominal process corner and a slow process corner. It can be seen that aside from the gain logarithmically increasing over time, the gain at the fast process corner 242 is significantly higher at the gain at the slow process corner 256.

Figure 2E:
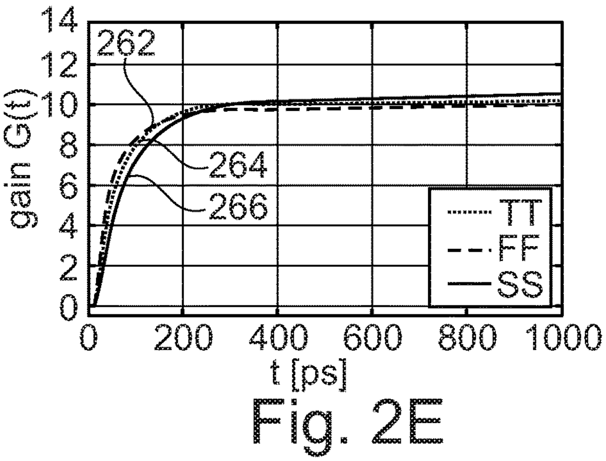

FIG. 2E illustrates a comparison of gain with respect to time for embodiment nested FIDA system 200 having a common scaling factor F of 12 and a self-gain of about 60, which yields a gain of 10. Traces 262, 264 and 266 represent the voltage gain of embodiment nested FIDA system 200 for a fast process corner, a nominal process corner and a slow process corner. It can be seen that gain converges to 10 with very little gain variation over fast, nominal and slow process corners 262, 264 and 266. (The very small gain variations seen are due to variations of self-gain μ over process.) The performance of nested FIDA system 200 over conventional FIDA system 100 shows similar improvement under variations of supply voltage and temperature.

It should be understood that the performance of conventional FIDA system 100 and embodiment nested FIDA system 200 in FIGS. 2C, 2D and 2E is just one illustrative example. The performance of other example systems may vary based on the specific implementations; however, conventional FIDA systems generally have a logarithmic gain characteristic over time and are sensitive to PVT variations and random mismatch, while embodiment nested FIDA systems generally have a gain that converges to a particular value over time and are less sensitive to PVT variations and random mismatch than conventional FIDA systems. Accordingly, it can be seen that a predictable gain can be achieved using an embodiment nested FIDA system by sampling the output after a certain number of time constants depending on the gain accuracy desired. Since the gain settles to a predetermined value, the timing of the sampling phase does not significantly affect the accuracy of the nested FIDA amplifier. On the other hand, the time-dependent logarithmic gain characteristic of the conventional FIDA amplifier places significant constrains regarding the timing of the sampling phase if gain accuracy is important to system operation.

Figure 3A:
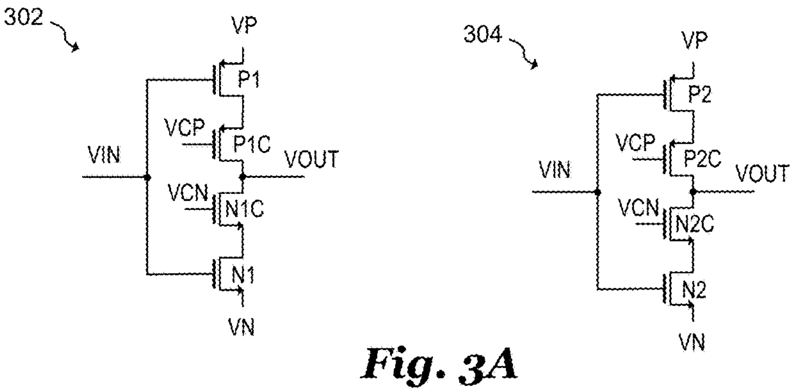
FIG. 3A illustrates schematics of inverter circuits according to an alternative embodiment that may be used in an embodiment nested FIDA system.

It should be appreciated that nested FIDA system 200 is just one example of many possible ways to implement an embodiment nested FIDA system. For example, inverters 104A, 104B, 206A and 206B may be implemented differently, as shown in FIG. 3A, which illustrates cascoded inverter circuit 302 that could be used to implement inverters 104A and 104B and cascoded inverter circuit 304 that could be used to implement inverters 206A and 206B in order to provide an increased output impedance. As shown, cascoded inverter 302 includes PMOS transistors P1 and P1C, and NMOS transistors N1 and N1C. Similarly, cascoded inverter 304 includes PMOS transistors P2 and P2C, and NMOS transistors N2 and N2C, where NMOS transistors N1C and N2C and PMOS transistors P1C and P2C function as cascode transistors. The voltage of node VCP coupled to the gates of PMOS transistors P1C and P2C and the voltage of node VCN coupled to the gates of NMOS transistors N1C and N2C may be generated using cascode biasing circuitry (not shown) as known in the art.

Figure 3B:
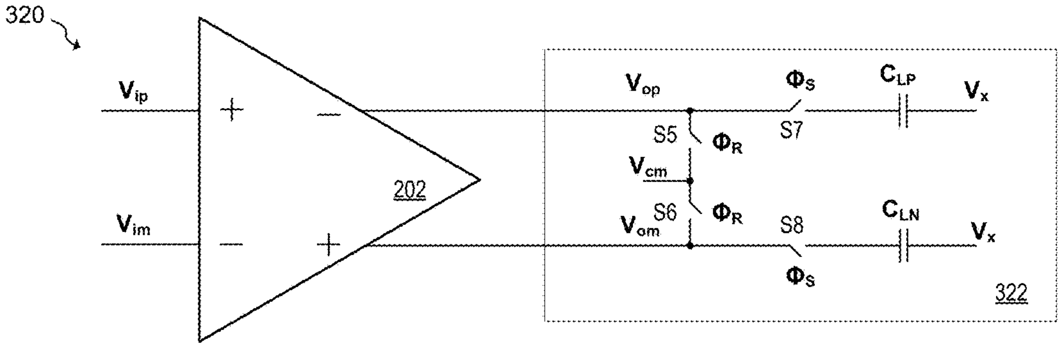
FIGS. 3B, 3C and 3D illustrate schematics of FIDA systems according to alternative embodiments.

It should be further appreciated that load circuit 112 depicted in FIG. 2A is just one of a number of possible load circuits that could be interfaced with embodiment nested FIDA core 202. For example, as shown in FIG. 3B, nested FIDA system 320 includes the nested FIDA core 202 of FIG. 2A coupled to load circuit 322 in which load capacitor $C_L$ is replaced by two load capacitors $C_{LP}$ and $C_{LN}$ having terminals coupled to node $V_x$. As shown load capacitor $C_{LP}$ is coupled between switch S7 and node $V_x$, and capacitor $C_{LN}$ is coupled between switch S8 and node $V_x$. Operation of load circuit 322 is similar to load circuit 112 described above.

Figure 3C:
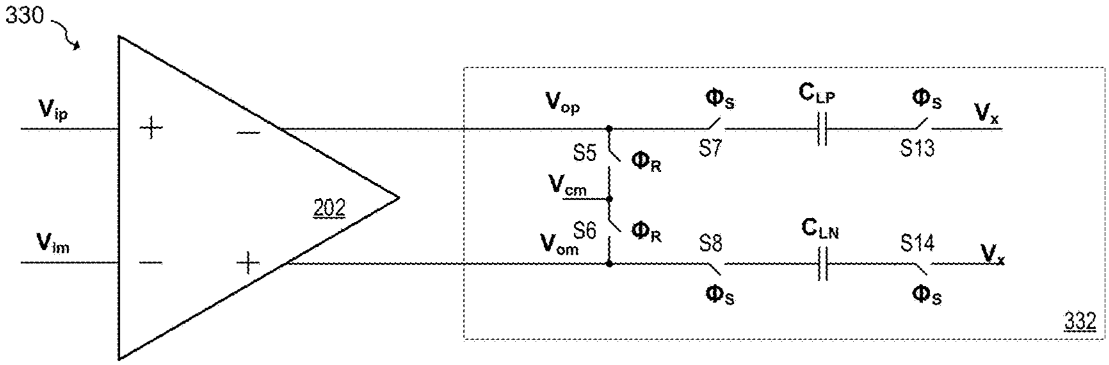

FIG. 3C illustrates nested FIDA system 330 that includes nested FIDA core 202 coupled to load circuit 332. Load circuit 332 is similar to load circuit 322 shown in FIG. 3B with the addition of switch S13 coupled between capacitor $C_{LP}$ and node $V_x$ and switch S14 coupled between capacitor $C_{LN}$ and node $V_x$. As shown, switches S13 and S14 are controlled by sampling switching signal $\Phi_s$, as are switches S7 and S8.

Figure 3D:
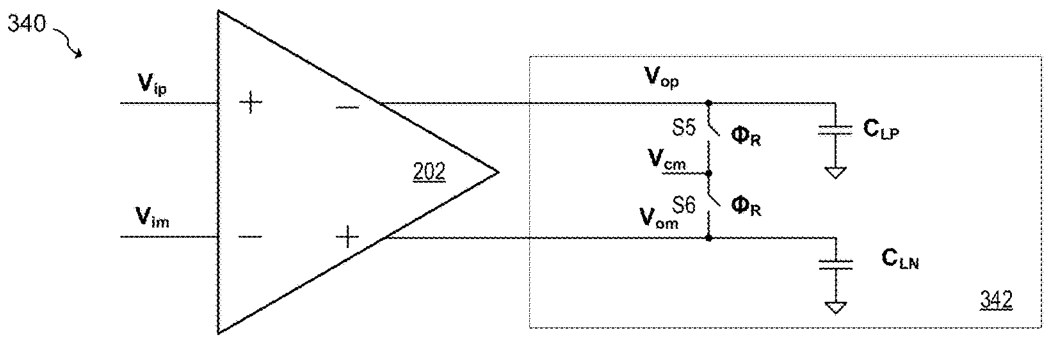

FIG. 3D illustrates nested FIDA system 340 that includes nested FIDA core 202 coupled to load circuit 342 that includes switches S5 and S6 that switchably couple output nodes $V_{op}$ and $V_{om}$ to common mode voltage node $V_{CM}$, and two capacitors $C_{LP}$ and $C_{LM}$ that are respectively coupled between $V_{op}$ and $V_{om}$ and ground. During operation, common mode voltage $V_{cm}$ is applied to output nodes $V_{or}$ and $V_{om}$ when reset switching signal (R is asserted. When amplification switching signal $\Phi_A$ is asserted, the outputs of inverters 104A and 104B are applied to capacitors $C_{LP}$ and $C_{LM}$. Outputs $V_{or}$ and $V_{om}$ may be sampled by a further sampling circuit (not shown) in accordance with sampling switching signal $\Phi_S$, and/or may be coupled to a non-switching amplifier (not shown).

It should be understood that load circuits 112, 322, 332 and 342 are just four of many possible load circuit architectures that could be interfaced with embodiment nested FIDA cores.

Figure 3E:
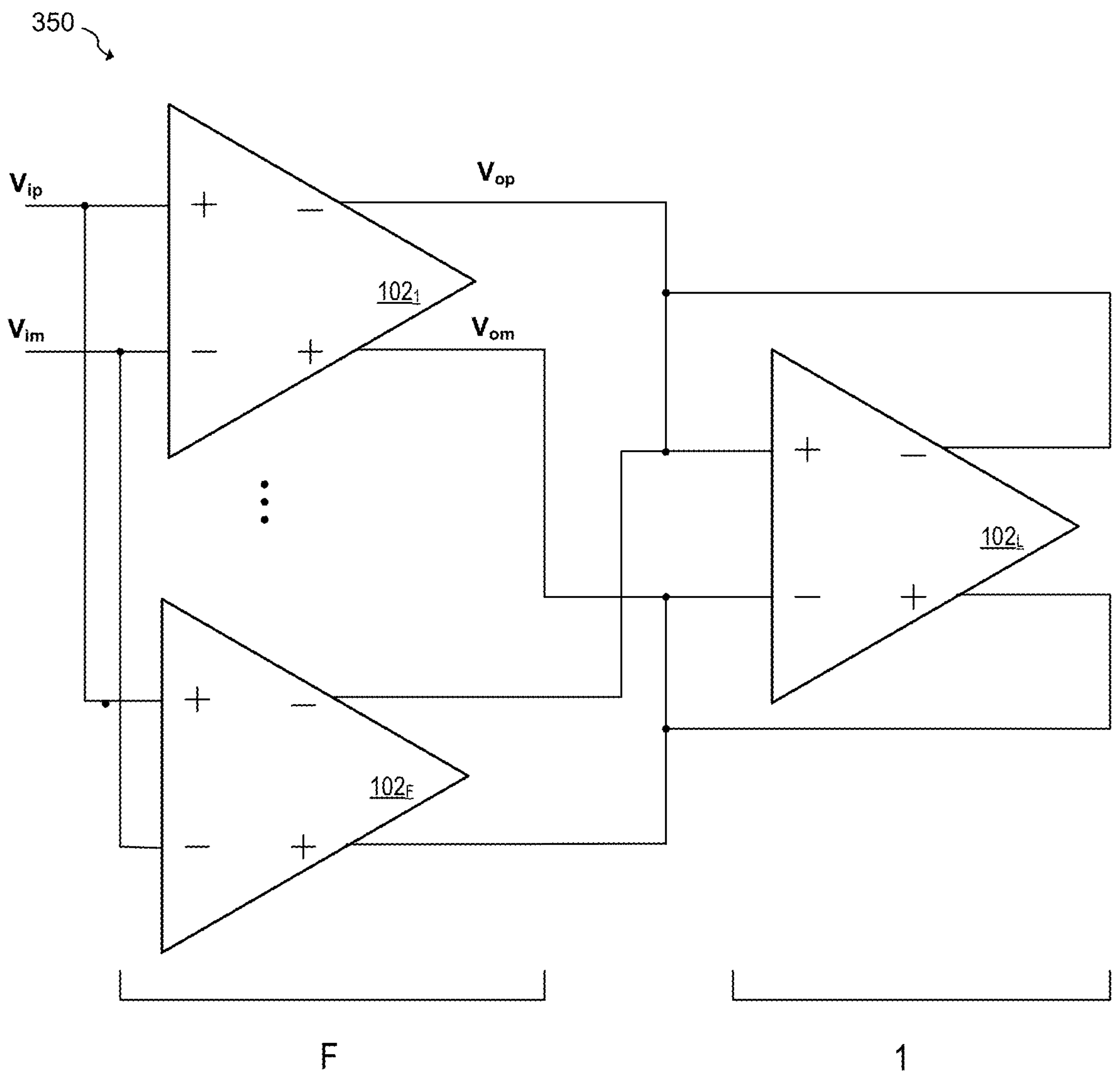
FIG. 3E illustrates an implementation of an embodiment nested FIDA core circuit.

FIG. 3E illustrates nested FIDA core 350 that may be used to implement nested FIDA core 202 shown in FIG. 2A. As shown nested FIDA core 350 includes of identical FIDA cores 102 as described above with respect to FIG. 1A. In embodiments, each of these FIDA cores has the same size reservoir capacitor $C_1$, inverters 104A and 104B and switches S1, S2, S3 and S4. The output of nested FIDA core 350 may be further coupled to a load circuit, such as load circuit 112 described above.

As shown, a first group of F FIDA cores $\mathbf{102}_1$ to $\mathbf{102}_F$ are coupled in parallel. A single FIDA core $1^{02L}$ having its positive input connected to its negative output and its negative input coupled to is positive output is coupled to the outputs of F FIDA cores $\mathbf{102}_1$ to $\mathbf{102}_F$. In various embodiments, the gain of FIDA core 350 may be adjusted by selecting the number of F FIDA cores used in the first group of FIDA cores $\mathbf{102}_1$ to $\mathbf{102}_F$. The resulting voltage gain of nested FIDA core 350 is about F. In some embodiments further gain adjustment may be achieved by coupling more than one FIDA core $\mathbf{102}_L$ having its inputs coupled to its outputs in parallel. For example, in an embodiment that utilizes two FIDA cores $\mathbf{102}_L$ coupled in parallel, the gain of FIDA core 350 would be about two.

Figure 4:
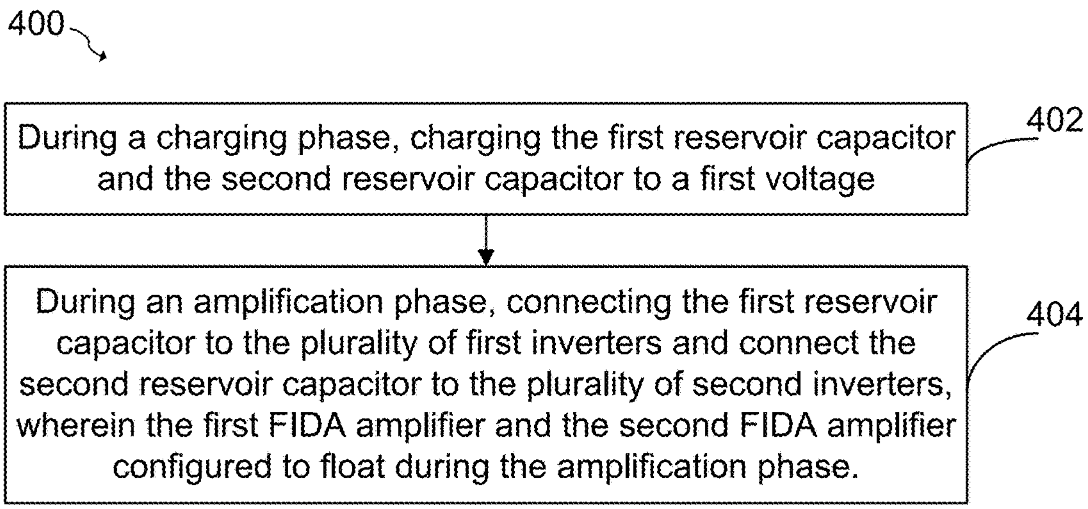
FIG. 4 illustrates a block diagram of a method according to an embodiment.

FIG. 4 illustrates a method 400 of operating an embodiment nested FIDA amplifier that may include first FIDA amplifier comprising a plurality of first inverters switchably coupled to a first reservoir capacitor and a second FIDA amplifier comprising a plurality of second inverters switchably coupled to a second reservoir capacitor. The first and second FIDA amplifiers may each be implemented, for example, using FIDA core circuit 102 described above with respect to FIG. 3E, or may be implemented according to the embodiment of FIG. 2A. Outputs of the plurality of first inverters are coupled to corresponding inputs of the plurality of second inverters.

As shown, the method involves at least two phases: a charging phase (step 402) and an amplification phase (step 404). During the charging phase 402, the first reservoir capacitor C1 and the second reservoir capacitor C2 are charged to a predefined voltage Vcm.

Moving to the amplification phase 404, the first reservoir capacitor C1 is connected to the plurality of first inverters 104A and 104B, and the second reservoir capacitor C2 is connected to the plurality of second inverters 206A and 206B. This configuration allows for the amplification process to take place. In various embodiments both the first FIDA amplifier 102 and the second FIDA amplifier are configured to float during the amplification phase.

Figure 5A:
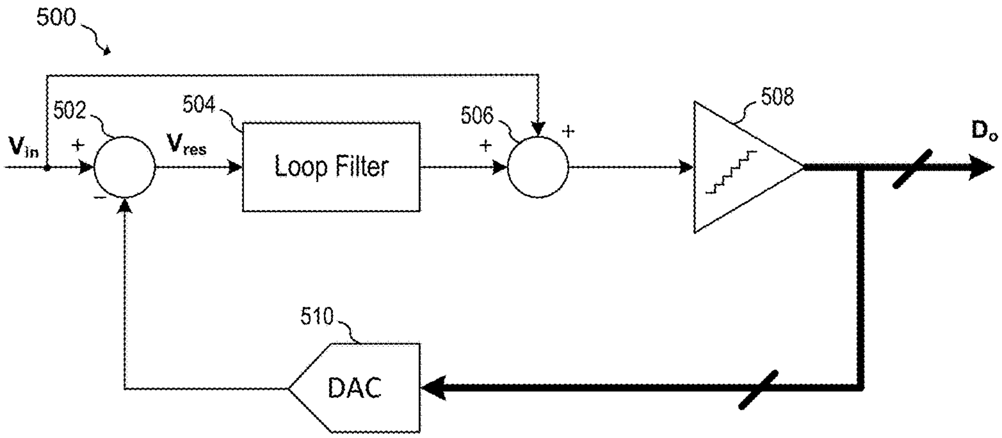
FIG. 5A illustrates a data converter that utilizes an embodiment nested FIDA system.

FIG. 5A illustrates a data converter 500 that may be configured to utilize embodiment nested FIDA systems. Data converter 500 may be implement using either a sigma delta modulator or a noise-shaping successive approximation (SAR) analog-to-digital converter (ADC). As shown, data converter 500 includes a loop filter 504, a quantizer 508, a digital-to-analog-converter (DAC) 510 and two summing circuits 502 and 506. In various embodiments, loop filter 504 includes at least one switched capacitor circuit, such as a switched capacitor amplifier or switched capacitor integrator, that utilizes a nested FIDA system according to an embodiment. During operation, summer 502 subtracts output of DAC 510 from input voltage to form a residue voltage $V_{res}$, which is then filtered by loop filter 504. The output of loop filter 504 is optionally summed with input voltage $V_{in}$ via a feedforward path and fed into quantizer 508. DAC 510 produces an output based on the output of quantizer 508 which is then subtracted from input voltage $V_{in}$. The feedback action of the loop depicted in FIG. 5A serves to push noise generated by quantizer 508 (including quantization noise) to higher frequencies, thereby increasing the signal-to-noise ratio for lower frequency signals.

In embodiment sigma-delta modulators, the quantizer 508 may be a one-bit quantizer implemented using, for example, a comparator circuit, or may be a multi-bit quantizer implemented using, for example, a flash ADC.

Figure 5B:
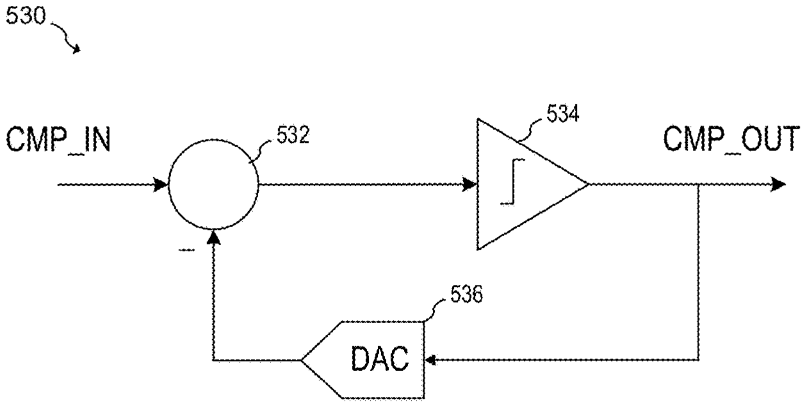
FIG. 5B illustrates a quantizer circuit that can be used in the data converter of FIG. 5A.

In a noise sampling SAR ADC, quantizer **5*o*8 may be implemented using a comparator with a DAC in a feedback path. For example, FIG. 5B illustrates quantizer 530 that may be used to implement quantizer 5*o*8 in a noise sampling SAR ADC. As shown, quantizer 530 includes a summer 502 having an output coupled to an input of comparator 534. A DAC 536 is coupled between the output of comparator 534 and an inverting input of summer 532**.

Figure 5C:
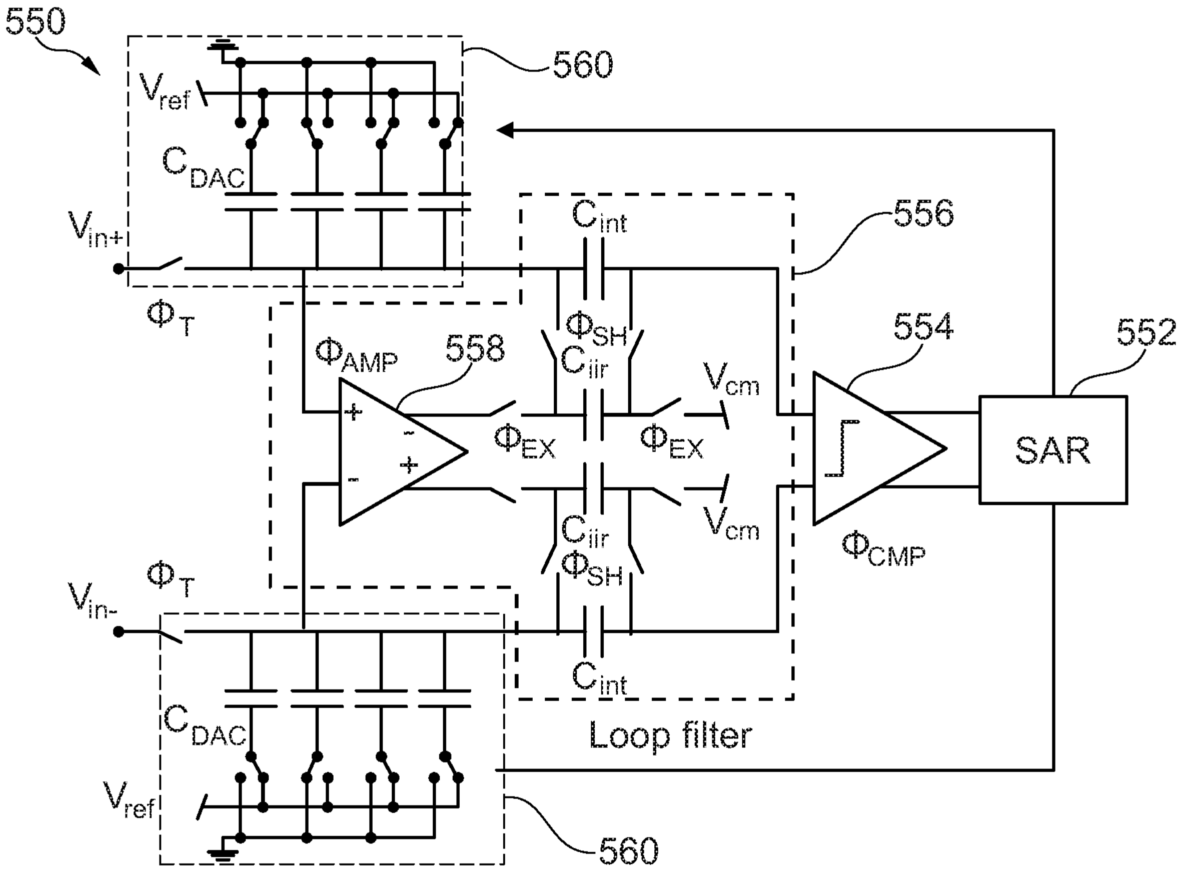
FIG. 5C illustrates a noise-shaping successive approximation (SAR) analog-to-digital converter (ADC) that utilizes an embodiment nested FIDA system.

Loop filter 504 may include one or more embodiment nested FIDA systems. By using an embodiment nested FIDA system, active amplifiers may be advantageously used in a power efficient manner to provide power efficient data converter operation. For example, FIG. 5C illustrates a schematic of noise shaping SAR ADC 550 that comparator 554, successive approximation register 552, capacitor-based DAC arrays **56*o* and loop filter 556. Loop filter 556 includes an embodiment FIDA amplifier 558**, integration capacitors $C_{int}$ and capacitors $C_{iir}$.

Figure 5D:
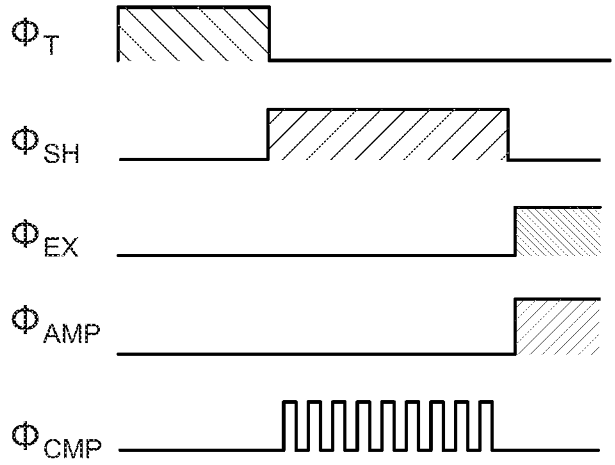
FIG. 5D illustrates a timing diagram associated with the noise shaping SAR ADC of FIG. 5C.

FIG. 5D illustrates a timing diagram that illustrates the operation of noise shaping SAR ADC 550 of FIG. 5C. During phase $\Phi_T$, Input voltages $V_{in+}$ and $V_{in-}$ are sampled on capacitors $C_{DAC}$ of capacitor-based DAC arrays 560. Next, during phase $\Phi_{SH}$ capacitors $C_{iir}$ and $C_{int}$ are connected together and share their charge. During this phase, comparator 554, successive approximation register 552, and capacitor-based DAC arrays 560 work together to perform a successive approximation of the voltage sampled on capacitors $C_{iir}$ and $C_{int}$. As shown, phase signal $\Phi_{CMP}$ is pulsed a plurality of times during phase $\Phi_{SH}$. Each time phase $\Phi_{SH}$ is active, comparator 554 measures the voltage sampled on capacitors $C_{iir}$ and $C_{int}$ and updates the value stored in successive approximation register 552, which then, in turn, updates the switching configuration applied to capacitors $C_{DAC}$ in capacitor-based DAC arrays 560.

Next, phase signals $\Phi_{EX}$ and $\Phi_{AMP}$ are asserted to activate embodiment FIDA amplifier 558 and to sample the output of embodiment FIDA amplifier 558 on capacitors $C_{iir}$. The switching cycle then repeats at the assertion of phase signal $\Phi_T$.

It should be understood that data converter systems and subsystems described with respect to FIGS. 5A-5D are just a few examples of many possible systems that could use embodiment nested FIDA amplifiers.

Embodiments of the present invention are summarized here. Other embodiments can also be understood from the entirety of the specification and the claims filed herein.

Example 1. A nested floating inverter dynamic amplifier (FIDA) including: a first FIDA amplifier including a plurality of first inverters switchably coupled to a first reservoir capacitor; and a second FIDA amplifier including a plurality of second inverters switchably coupled to a second reservoir capacitor, where outputs of the plurality of first inverters are coupled to corresponding inputs of the plurality of second inverters.

Example 2. The nested FIDA of example 1, where: a ratio of a transconductance of the first FIDA amplifier to the second FIDA amplifier is a first factor; and a ratio of a capacitance of the first reservoir capacitor to a capacitance of the second reservoir capacitor is the first factor.

Example 3. The nested FIDA of example 2, where: each of the plurality of the first inverters includes a first PMOS transistor and a first NMOS transistor; each of the plurality of the second inverters includes a second PMOS transistor and a second NMOS transistor; a ratio of an aspect ratio of the first PMOS transistor to an aspect ratio of the second PMOS transistor is the first factor; and a ratio of the aspect ratio of the first NMOS transistor to an aspect ratio of the second NMOS transistor is the first factor.

Example 4. The nested FIDA of one of examples 2 to 3, where a voltage gain of the nested FIDA is the first factor.

Example 5. The nested FIDA of one of examples 1 to 4, further including a controller configured to: during a charging phase, charge the first reservoir capacitor and the second reservoir capacitor to a first voltage; and during an amplification phase, connect the first reservoir capacitor to the plurality of first inverters and connect the second reservoir capacitor to the plurality of second inverters, where the first FIDA amplifier and the second FIDA amplifier are configured to float during the amplification phase.

Example 6. The nested FIDA of example 5, where the controller is further configured to, during a readout phase, disconnect at least one output capacitor from the outputs of the plurality of first inverters.

Example 7. The nested FIDA of one of examples 1 to 6, where an input of each second inverter of the plurality of second inverters is coupled to its corresponding output.

Example 8. The nested FIDA of one of examples 1 to 7, further including at least one output capacitor coupled to outputs of the plurality of first inverters.

Example 9. A method of operating a nested floating inverter dynamic amplifier (FIDA) including a first FIDA amplifier including a plurality of first inverters switchably coupled to a first reservoir capacitor, a second FIDA amplifier including a plurality of second inverters switchably coupled to a second reservoir capacitor, where outputs of the plurality of first inverters are coupled to corresponding inputs of the plurality of second inverters, the method including: during a charging phase, charging the first reservoir capacitor and the second reservoir capacitor to a first voltage; and during an amplification phase, connecting the first reservoir capacitor to the plurality of first inverters and connecting the second reservoir capacitor to the plurality of second inverters, where the first FIDA amplifier and the second FIDA amplifier are configured to float during the amplification phase.

Example 10. The method of example 9, further including, during a readout phase, disconnecting at least one output capacitor from outputs of the plurality of first inverters.

Example 11. The method of one of examples 9 or 10, further including transferring charge from the at least one output capacitor to a switched capacitor circuit during the readout phase.

Example 12. The method of one of examples 9 to 11 further including amplifying an input voltage applied to inputs of the plurality of first inverters during the amplification phase.

Example 13. A circuit including: a first inverter having an input coupled to a first input node; a first load inverter coupled to an output of the first inverter, where an input of the first load inverter is connected to an output of the first load inverter; a second inverter having an input coupled to a second input node; a second load inverter coupled to an output of the first inverter, where an input of the second load inverter is connected to an output of the second load inverter; a first reservoir capacitor switchably coupled to power supply nodes of the first inverter and the second inverter; and a second reservoir capacitor switchably coupled to power supply nodes of the first load inverter and the second load inverter.

Example 14. The circuit of example 13, where: a ratio of a strength of the first inverter to a strength of the first load inverter is a first factor; a ratio of a strength of the second inverter to a strength of the second load inverter is the first factor; and a ratio of a capacitance of the first reservoir capacitor to a capacitance of the second reservoir capacitor is the first factor.

Example 15. The circuit of one of examples 13 or 14, where: the first inverter includes a first NMOS transistor and a first PMOS transistor; the first load inverter includes a first NMOS load transistor and a first PMOS load transistor; the second inverter includes a second NMOS transistor and a second PMOS transistor; and the second load inverter includes a second NMOS load transistor and a second PMOS load transistor.

Example 16. The circuit of one of examples 13 to 15, further including a controller configured to: during a reset phase: disconnect the first reservoir capacitor from the power supply nodes of the first inverter and the second inverter and connect power supply terminals configured to provide a power supply voltage across terminals of the first reservoir capacitor, and disconnect the second reservoir capacitor from the power supply nodes of the first load inverter and the second load inverter and connect the power supply terminals across terminals of the second reservoir capacitor; and during an amplification phase disconnect the first reservoir capacitor from the power supply terminals and connect the terminals of the first reservoir capacitor to the power supply nodes of the first inverter and the second inverter, and disconnect the second reservoir capacitor from the power supply terminals and connect the terminals of the second reservoir capacitor to the power supply nodes of the first load inverter and the second load inverter.

Example 17. The circuit of example 16, where the controller is further configured to: during the reset phase, couple at least one output capacitor and the outputs of the first inverter and the second inverter to a reference voltage node configured to provide a reference voltage; and during the amplification phase, disconnect the at least one output capacitor and the outputs of the first inverter and the second inverter from the reference voltage node, and connect the at least one output capacitor to the output of the first inverter and to the output of the second inverter.

Example 18. The circuit of example 17, where the controller is further configured to disconnect the at least one output capacitor from the first inverter and from the second inverter during a readout phase.

Example 19. The circuit of one of examples 13 to 18, further including: a first switch coupled between a first terminal of the first reservoir capacitor and a first power supply terminal; a second switch coupled between a second terminal of the first reservoir capacitor and a second power supply terminal; a third switch coupled between a first terminal of the second reservoir capacitor and the first power supply terminal; a fourth switch coupled between a second terminal of the second reservoir capacitor and the second power supply terminal; a fifth switch coupled between the first terminal of the first reservoir capacitor and first power supply nodes of the first inverter and the second inverter; a sixth switch coupled between the second terminal of the first reservoir capacitor and second power supply nodes of the first inverter and the second inverter; a seventh switch coupled between the first terminal of the second reservoir capacitor and first power supply nodes of the first load inverter and the second load inverter; an eighth switch coupled between the second terminal of the second reservoir capacitor and second power supply nodes of the first load inverter and the second load inverter; a ninth switch coupled between the output of the first inverter and a reference voltage node; and a tenth switch coupled between the output of the second inverter and the reference voltage node.

Example 20. The circuit of example 19, further including: an eleventh switch coupled between the output of the first inverter and at least one output capacitor; and a twelfth switch coupled between the output of the second inverter and the at least one output capacitor.

Example 21. The circuit of one of examples 19 to 20, further including a controller configured to: during a reset phase turning on the first, second, third, fourth, ninth and tenth switches, and turning off the fifth, sixth, seventh, and eighth switches; and during an amplification phase turning on the fifth, sixth, seventh, and eighth switches, and turning off the first, second, third, fourth, ninth and tenth switches.

Example 22. The circuit of example 21, where the controller is further configured to turn off the eleventh and twelfth switch during a readout phase.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A nested floating inverter dynamic amplifier (FIDA) comprising:

a first FIDA amplifier comprising a plurality of first inverters switchably coupled to a first reservoir capacitor; and a second FIDA amplifier comprising a plurality of second inverters switchably coupled to a second reservoir capacitor, wherein outputs of the plurality of first inverters are coupled to corresponding inputs of the plurality of second inverters, and the input of each second inverter of the plurality of second inverters is direct current (dc) coupled to its corresponding output.

2. The nested FIDA of claim 1, wherein:

a ratio of a transconductance of the first FIDA amplifier to the second FIDA amplifier is a first factor; and a ratio of a capacitance of the first reservoir capacitor to a capacitance of the second reservoir capacitor is the first factor.

3. The nested FIDA of claim 2, wherein:

each of the plurality of the first inverters comprises a first PMOS transistor and a first NMOS transistor;

each of the plurality of the second inverters comprises a second PMOS transistor and a second NMOS transistor;

a ratio of an aspect ratio of the first PMOS transistor to an aspect ratio of the second PMOS transistor is the first factor; and a ratio of the aspect ratio of the first NMOS transistor to an aspect ratio of the second NMOS transistor is the first factor.

4. The nested FIDA of claim 2, wherein a voltage gain of the nested FIDA is the first factor.

5. The nested FIDA of claim 1, further comprising a controller configured to:

during a charging phase, charge the first reservoir capacitor and the second reservoir capacitor to a first voltage; and during an amplification phase, connect the first reservoir capacitor to the plurality of first inverters and connect the second reservoir capacitor to the plurality of second inverters, wherein the first FIDA amplifier and the second FIDA amplifier are configured to float during the amplification phase.

6. The nested FIDA of claim 5, wherein the controller is further configured to, during a readout phase, disconnect at least one output capacitor from the outputs of the plurality of first inverters.

7. The nested FIDA of claim 1, wherein the input of each second inverter of the plurality of second inverters is directly connected to its corresponding output.

8. The nested FIDA of claim 1, further comprising at least one output capacitor coupled to the outputs of the plurality of first inverters.

9. A method of operating a nested floating inverter dynamic amplifier (FIDA) comprising a first FIDA amplifier comprising a plurality of first inverters switchably coupled to a first reservoir capacitor, a second FIDA amplifier comprising a plurality of second inverters switchably coupled to a second reservoir capacitor, wherein outputs of the plurality of first inverters are coupled to corresponding inputs of the plurality of second inverters, and the input of each second inverter of the plurality of second inverters is direct current (dc) coupled to its corresponding output, the method comprising:

during a charging phase, charging the first reservoir capacitor and the second reservoir capacitor to a first voltage; and during an amplification phase, connecting the first reservoir capacitor to the plurality of first inverters and connecting the second reservoir capacitor to the plurality of second inverters, wherein the first FIDA amplifier and the second FIDA amplifier are configured to float during the amplification phase.

10. The method of claim 9, further comprising, during a readout phase, disconnecting at least one output capacitor from the outputs of the plurality of first inverters.

11. The method of claim 10, further comprising transferring charge from the at least one output capacitor to a switched capacitor circuit during the readout phase.

12. The method of claim 9, further comprising amplifying an input voltage applied to inputs of the plurality of first inverters during the amplification phase.

13. A circuit comprising:

a first inverter having an input coupled to a first input node;

a first load inverter coupled to an output of the first inverter, wherein an input of the first load inverter is direct current (dc) coupled to an output of the first load inverter;

a second inverter having an input coupled to a second input node;

a second load inverter coupled to an output of the second inverter, wherein an input of the second load inverter is direct current (dc) coupled to an output of the second load inverter;

a first reservoir capacitor switchably coupled to power supply nodes of the first inverter and the second inverter; and a second reservoir capacitor switchably coupled to power supply nodes of the first load inverter and the second load inverter.

14. The circuit of claim 13, wherein:

a ratio of a strength of the first inverter to a strength of the first load inverter is a first factor;

a ratio of a strength of the second inverter to a strength of the second load inverter is the first factor; and a ratio of a capacitance of the first reservoir capacitor to a capacitance of the second reservoir capacitor is the first factor.

15. The circuit of claim 13, wherein:

the first inverter comprises a first NMOS transistor and a first PMOS transistor;

the first load inverter comprises a first NMOS load transistor and a first PMOS load transistor;

the second inverter comprises a second NMOS transistor and a second PMOS transistor; and the second load inverter comprises a second NMOS load transistor and a second PMOS load transistor.

16. The circuit of claim 13, further comprising a controller configured to:

during a reset phase:

disconnect the first reservoir capacitor from the power supply nodes of the first inverter and the second inverter and connect power supply terminals configured to provide a power supply voltage across terminals of the first reservoir capacitor, and disconnect the second reservoir capacitor from the power supply nodes of the first load inverter and the second load inverter and connect the power supply terminals across terminals of the second reservoir capacitor; and during an amplification phase disconnect the first reservoir capacitor from the power supply terminals and connect the terminals of the first reservoir capacitor to the power supply nodes of the first inverter and the second inverter, and disconnect the second reservoir capacitor from the power supply terminals and connect the terminals of the second reservoir capacitor to the power supply nodes of the first load inverter and the second load inverter.

17. The circuit of claim 16, wherein the controller is further configured to:

during the reset phase, couple at least one output capacitor and the outputs of the first inverter and the second inverter to a reference voltage node configured to provide a reference voltage; and during the amplification phase, disconnect the at least one output capacitor and the outputs of the first inverter and the second inverter from the reference voltage node, and connect the at least one output capacitor to the output of the first inverter and to the output of the second inverter.

18. The circuit of claim 17, wherein the controller is further configured to disconnect the at least one output capacitor from the first inverter and from the second inverter during a readout phase.

19. The circuit of claim 13, further comprising:

a first switch coupled between a first terminal of the first reservoir capacitor and a first power supply terminal;

a second switch coupled between a second terminal of the first reservoir capacitor and a second power supply terminal;

a third switch coupled between a first terminal of the second reservoir capacitor and the first power supply terminal;

a fourth switch coupled between a second terminal of the second reservoir capacitor and the second power supply terminal;

a fifth switch coupled between the first terminal of the first reservoir capacitor and first power supply nodes of the first inverter and the second inverter;

a sixth switch coupled between the second terminal of the first reservoir capacitor and second power supply nodes of the first inverter and the second inverter;

a seventh switch coupled between the first terminal of the second reservoir capacitor and first power supply nodes of the first load inverter and the second load inverter;

an eighth switch coupled between the second terminal of the second reservoir capacitor and second power supply nodes of the first load inverter and the second load inverter;

a ninth switch coupled between the output of the first inverter and a reference voltage node; and a tenth switch coupled between the output of the second inverter and the reference voltage node.

20. The circuit of claim 19, further comprising:

an eleventh switch coupled between the output of the first inverter and at least one output capacitor; and a twelfth switch coupled between the output of the second inverter and the at least one output capacitor.

21. The circuit of claim 19, further comprising a controller configured to:

during a reset phase;

turning on the first, second, third, fourth, ninth and tenth switches, and turning off the fifth, sixth, seventh, and eighth switches; and during an amplification phase;

turning on the fifth, sixth, seventh, and eighth switches, and turning off the first, second, third, fourth, ninth and tenth switches.

22. The circuit of claim 20, further comprising a controller configured to turn off the eleventh switch and the twelfth switch during a readout phase.

* * * * *